United States Patent
Dahl et al.

(10) Patent No.: US 9,691,885 B2
(45) Date of Patent: Jun. 27, 2017

(54) METHOD FOR MANUFACTURING A TRANSISTOR

(71) Applicant: Infineon Technologies Dresden GmbH, Dresden (DE)

(72) Inventors: Claus Dahl, Dresden (DE); Dmitri Alex Tschumakow, Dresden (DE)

(73) Assignee: Infineon Technologies Dresden GmbH, Dresden (DE)

( * ) Notice: Subject to any disclaimer, the term of this patent is extended or adjusted under 35 U.S.C. 154(b) by 0 days.

(21) Appl. No.: 15/066,396

(22) Filed: Mar. 10, 2016

(65) Prior Publication Data

US 2016/0268402 A1 Sep. 15, 2016

(30) Foreign Application Priority Data

Mar. 11, 2015 (DE) .................. 10 2015 204 411

(51) Int. Cl.

| | |
|---|---|
| *H01L 29/732* | (2006.01) |
| *H01L 29/08* | (2006.01) |
| *H01L 29/10* | (2006.01) |
| *H01L 29/423* | (2006.01) |
| *H01L 29/45* | (2006.01) |
| *H01L 29/06* | (2006.01) |
| *H01L 29/66* | (2006.01) |
| *H01L 29/40* | (2006.01) |
| *H01L 21/265* | (2006.01) |
| *H01L 29/165* | (2006.01) |

(52) U.S. Cl.
CPC ........ *H01L 29/732* (2013.01); *H01L 29/0649* (2013.01); *H01L 29/0804* (2013.01); *H01L 29/0821* (2013.01); *H01L 29/1004* (2013.01); *H01L 29/401* (2013.01); *H01L 29/42304* (2013.01); *H01L 29/45* (2013.01); *H01L 29/66272* (2013.01); *H01L 21/26506* (2013.01); *H01L 29/165* (2013.01)

(58) Field of Classification Search
CPC .................. H01L 29/732; H01L 29/73252
USPC ....................................... 438/320
See application file for complete search history.

(56) References Cited

U.S. PATENT DOCUMENTS

| 6,686,250 B1 | 2/2004 | Kalnitsky et al. |
| 7,005,723 B2 | 2/2006 | Tilke et al. |
| 7,087,940 B2 * | 8/2006 | Khater ............ H01L 29/1004 |
| | | 257/197 |

(Continued)

*Primary Examiner* — Dung Le

(74) *Attorney, Agent, or Firm* — Harrity & Harrity, LLP

(57) ABSTRACT

A method comprises arranging a stack, on a semiconductor substrate, comprising a sacrificial layer and an insulating layer. The insulator layer is at least partially arranged between the semiconductor substrate and the sacrificial layer. A recess is formed within the stack. The recess extends through the stack to the semiconductor substrate so that the recess at least partially overlaps with a surface of the collector region of the semiconductor substrate. The collector region extends from a main surface of the semiconductor substrate into the substrate material. The method further comprises generating a base structure at the collector region and in the recess. The base structure contacts and covers the collector region within the recess of the sacrificial layer. The method further comprises generating an emitter structure at the base structure. The emitter structure contacts and at least partially covers the base structure within the recess of the sacrificial layer.

16 Claims, 13 Drawing Sheets

(56) References Cited

U.S. PATENT DOCUMENTS

2014/0327106 A1 11/2014 Liu
2015/0357446 A1* 12/2015 Tschumakow .... H01L 29/66242
  257/586

* cited by examiner

FIG 1B

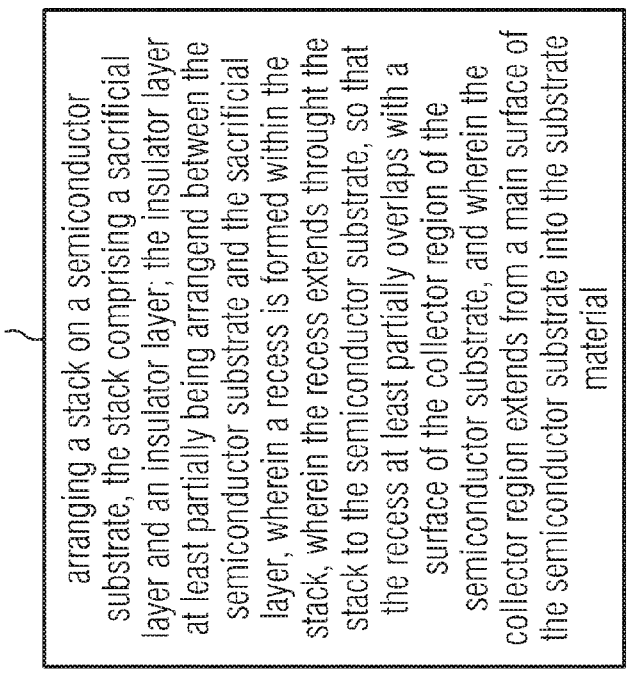

arranging a stack on a semiconductor substrate, the stack comprising a sacrificial layer and an insulator layer; the insulator layer at least partially being arrangend between the semiconductor substrate and the sacrificial layer, wherein a recess is formed within the stack, wherein the recess extends throught the stack to the semiconductor substrate, so that the recess at least partially overlaps with a surface of the collector region of the semiconductor substrate, and wherein the collector region extends from a main surface of the semiconductor substrate into the substrate material

FIG 1A

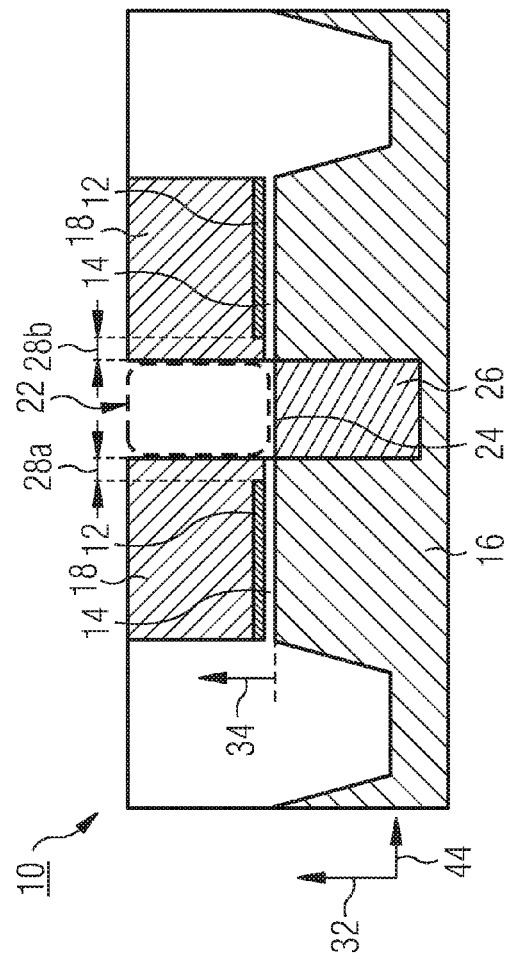

generating a base structure at a the collector region and in the recess, wherein the base structure contacts and covers the collector region within the recess of the sacrificial layer — 120

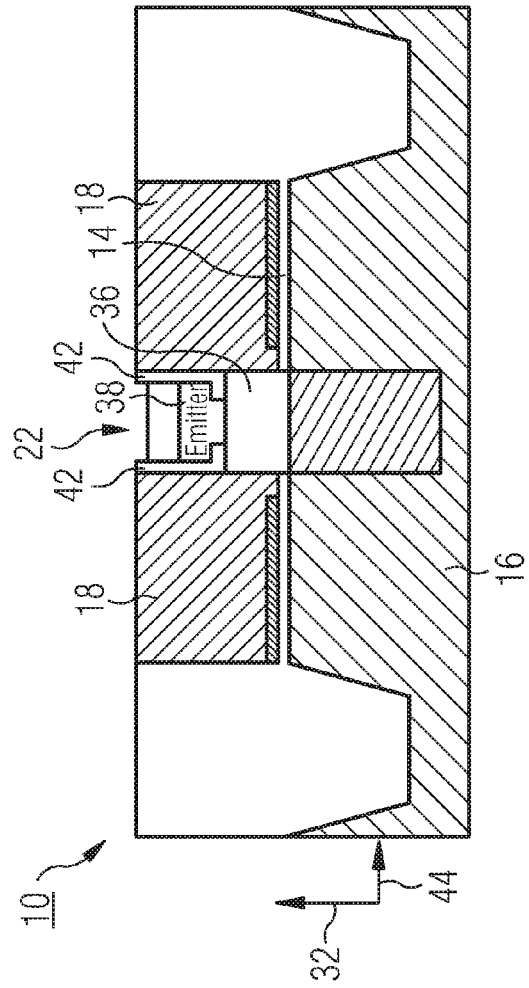

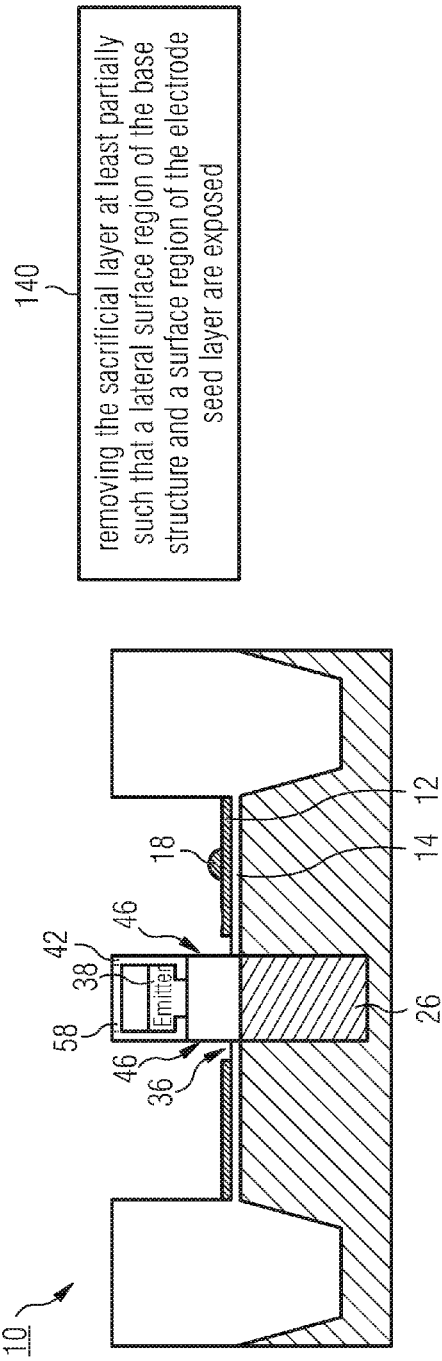

generating a doped electrode layer by epitaxially growing a semiconductor material to the exposed surface regions of the base structure and the electrode seed layer, such that the doped electrode layer connects the lateral surface region of the base structure and the surface region of electrode seed layer removing the sacrificial layer and the electrode seed layer in a separating region exceeding a region of the recess — 102 re-arranging the sacrificial layer in the separating region such that the recess is formed and such that the electrode seed layer is separated from the recess by the rearrangend sacrificial layer

104

106 — generating the collector region in the semiconductor substrate by implantation, wherein the implantation is performed through the insulator layer generating a spacer structure at the base structure and in the recess at a main surface region of the base structure and before the emitter structure is generated, wherein the emitter structure is generated in the recess at a portion of the main surface region of the base structure uncovered by the spacer strucure 132 — arranging an insulator material at the emitter structure such that the emitter structure is encapsulated by the oxide material, the spacer structure and the base structure.

METHOD FOR MANUFACTURING A TRANSISTOR

RELATED APPLICATION

This application claims priority under to German Patent Application No. 102015204411.4, filed on Mar. 11, 2015, the content of which is incorporated by reference herein in its entirety.

DESCRIPTION

Field

Embodiments of the present invention relate to a method that may be used in transistor fabrication. Some embodiments relate to a transistor. Further embodiments relate to a fully self-aligned hetero junction bipolar device with pure single crystal base link architecture.

Background

It is possible to manufacture different kinds of transistors. Transistors may be manufactured using different technologies. Some transistors may be manufactured as a stack of layers comprising different functionalities. Other transistors may be manufactured in plane comprising different regions comprising different functionalities. Performance of the transistor may be influenced by defects and/or a degree of purity of materials used. Furthermore, relative positions of different regions with respect to each other may influence performance of the transistor.

SUMMARY

A method is provided that comprises:

Arranging a stack on a semiconductor substrate, the stack comprising a sacrificial layer and an insulator layer. The insulator layer is at least partially arranged between the semiconductor substrate and the sacrificial layer. A recess is formed within the stack, wherein the recess extends through the stack to the semiconductor substrate, so that the recess at least partially overlaps with a surface of the collector region of the semiconductor substrate. The collector region extends from a main surface of the semiconductor substrate into the substrate material. The method further comprises generating a base structure at a the collector region and in the recess, wherein the base structure contacts and covers the collector region within the recess of the sacrificial layer. The method further comprises generating an emitter structure at the base structure, wherein the emitter structure contacts and at least partially covers the base structure within the recess of the sacrificial layer. The method comprises removing the sacrificial layer at least partially such that a lateral surface region of the base structure is exposed and generating a doped electrode layer by epitaxially growing a semiconductor material to the exposed lateral surface region of the base structure, such that the doped electrode layer connects the lateral surface region of the base structure.

Further embodiments provide a transistor comprising a semiconductor substrate comprising a collector region extending from a main surface of the semiconductor substrate into the substrate material. The transistor further comprises a base structure arranged at the collector region along a thickness direction parallel to a direction of a normal of the main surface of the semiconductor substrate and an emitter structure arranged at the base structure averted from the semiconductor substrate and along the thickness direction. The transistor further comprises a doped electrode layer arranged at a lateral surface region of the base structure and along a lateral direction perpendicular to the thickness direction. The doped electrode layer and the base structure form a monocrystalline connection.

Before embodiments are described in detail using the accompanying figures, it is to be pointed out that the same or functionally equal elements are given the same reference numbers in the figures and that a repeated description for elements provided with the same reference numbers is omitted. Hence, descriptions provided for elements having the same reference numbers are mutually exchangeable.

BRIEF DESCRIPTION OF THE DRAWINGS

FIG. 1a illustrates a schematic side view of a stack arranged in a step of a method for manufacturing a transistor according to an embodiment;

FIG. 1b shows the step of FIG. 1a according to an embodiment;

FIG. 3a shows a schematic side view after a step during which an generating an emitter structure according to an embodiment;

FIG. 3b shows the step of FIG. 3a according to an embodiment;

FIG. 4a shows a schematic side view of the stack after a step during which a sacrificial layer is removed according to an embodiment;

FIG. 4b shows the step of FIG. 4a according to an embodiment;

DETAILED DESCRIPTION

Figure 2B:
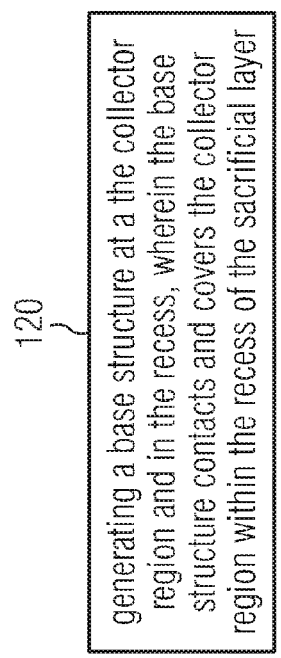
FIG. 2b shows the step of FIG. 2a according to an embodiment.

In the following, reference will be made to a method for manufacturing a transistor, in particular an npn-transistor. The method may also be used for manufacturing other transistors comprising a doping of a first type (e.g., n or p) and a material comprising a doping of a second type (e.g., p or n). By non-limiting example only, this may refer to pnp-transistors or other transistors comprising a hetero junction between semiconductor regions comprising different materials and/or different degrees of doping such as metal oxide semiconductor transistors (MOS), for example comprising an elevated source-grain region.

Reference will be made to a method for manufacturing a transistor using a silicon material as a substrate material or depositing material. The method described in the following may also refer to other semiconductor materials used as substrate material and/or material deposited such as gallium arsenide. By non-limiting example only, as a dopant material for doping the semiconductor material, a carbon material and/or a boron material may be used.

FIGS. 1a to 5b schematically illustrate process flow examples of the proposed method for manufacturing a transistor. Part a of the respective figure illustrates a schematic side view of an (intermediate) product, wherein part b of the respective figure illustrates parts of a flow chart explaining the method.

FIG. 1a illustrates a schematic side view of a stack 10 arranged or provided in a step 110 of a method for manufacturing a transistor, the step 110 shown in FIG. 1b.

The step 110 comprises arranging the stack 10 on the semiconductor substrate 16, the stack 10 comprising a sacrificial layer 18 and an insulator layer 14. The insulator layer 14 is at least partially arranged between the semiconductor substrate 16 and the sacrificial layer 18. A recess 22 is formed within the stack 10, the recess 22 extending through the stack 10 to the semiconductor substrate 16, so that the recess 22 at least partially overlaps with a surface of the collector region 26 of the semiconductor substrate 16. A collector region 26 of the semiconductor substrate 16 extends from the main surface 24 of the semiconductor substrate 16 into the substrate material.

The stack 10 may comprise an optional electrode seed layer 12. The following descriptions refer to the electrode seed layer which later may allow for an enhanced electrode growth. However, the electrode seed layer 12 is optional, i.e., it may be not arranged. When the electrode seed layer 12 is arranged, the electrode seed layer may be arranged between the insulator layer 14 and the sacrificial layer 18. The electrode seed layer 12 may comprise, for example, an amorphous silicon material or a polysilicon material.

The collector region 26 which may be formed, for example, as a doped region of the semiconductor substrate with respect to other regions of the semiconductor substrate. For example, the semiconductor substrate may be a silicon material. The silicon material may be doped, for example, with a carbon material such that a silicon carbide (SiC) material may be obtained in the collector region 26. The semiconductor substrate 16 may comprise a low doping which may be, for example, in the range of $10^9$. The collector region 26 may comprise a doping which may be, for example, in the range from $10^{15}$ to $10^{19}$, wherein a high(er) doping may allow for higher frequencies by which the transistor may be switched. Alternatively, a low(er) doping, for example, such as $10^{16}$ may allow for increased voltages to be applied to the transistor.

The collector region 26 may extend from the main surface 24 into the substrate material, i.e., into the semiconductor substrate 16. The recess 22 at least partially overlaps with the collector region 26 but may also overlap completely. Thus, the collector region 26 is exposed (i.e., processable) through the stack 10 and through the recess 22 at portions thereof overlapping with the recess 22.

When the electrode seed layer 12 is arranged, the sacrificial layer 18 spaces the electrode seed layer 12 from the recess 22. The electrode seed layer 12 may be interrupted by the recess 22, i.e., comprising more than one part or region but may also comprise a planar extension comprising by means of the recess 22 a notch (hole), the notch surrounded by the electrode seed layer 12. Thus, the electrode seed layer 12 may also be formed integrally. The sacrificial layer 18 spaces the electrode seed layer 12 from the recess 22 by a distance 28a and/or 28b. When the electrode seed layer 12 is formed as an integral layer comprising the notch, the distances 28a and 28b may be understood as a notch of the electrode seed layer 12 comprising a larger extension (e.g., a diameter) when compared to the recess 22, the different extensions forming the distances 28a and 28b. Alternatively, the distances 28a and 28b may be understood as distances by which the respective part of the electrode seed layer 12 is set back with respect to the recess 22. Distances 28a and 28b may be different but may also be essentially equal to obtain a higher degree of symmetry and thus a high degree of efficiency when operating the later transistor.

The distances 28a and 28b may be at least 1 nanometer and at most 200 nanometer. According to another embodiment, the distances 28a and 28b may be at least 3 nanometer and at the most 150 nanometer. According to a further embodiment, the distances 28a and 28b may be at least 5 nanometer and at most 100 nanometer.

Different layers of the stack 10 and/or the semiconductor substrate 16 may comprise a varying and/or different thickness along a thickness direction 32. The thickness may be understood as an extension of the stack 10, a layer thereof or the semiconductor substrate 16. The thickness direction 32 may be arranged parallel or essentially parallel with respect to a surface normal 34 of the semiconductor substrate 16. As a non-limiting example, the thickness direction 32 may be arranged perpendicular (e.g., parallel to a height direction) when referring to a lateral direction 44 of the stack 10 or the semiconductor substrate 16. The lateral direction may be parallel to the main surface 24.

At regions at which the insulator layer 14 is arranged between the sacrificial layer 18 (or the electrode seed layer 12) and the silicon substrate 16, the insulator layer 14 may comprise a thickness of at least 1 nanometer and at most 200 nanometer, of at least 10 nanometer and at most 150 nanometer or of at least 50 nanometer and at most 100 nanometer. For example, an aim during manufacturing may be to obtain a thickness of the insulator layer 14 in this region, that is as small as possible but sufficient for providing a breakdown voltage which is higher than a voltage to be applied to the later transistor. Preferably, at least a portion of the insulator layer 14 may comprise a lower thickness when compared to the thickness of the base structure 36 such that when the sacrificial layer 18 is removed, a lateral surface region of the base structure 36 may be exposed. The insulating layer 14 comprising a lower thickness than the base structure 36 further allows for depositing layers at a level (by non-limiting example, a horizontal level) of the base structure 36.

The insulator layer 14 and the sacrificial layer 18 may comprise, for example, an oxide material such as a silicon oxide material or a (silicon) nitride material. The sacrificial layer 18 and the insulator layer 14 may comprise, different etching properties during etching when compared to each other. For example, the insulator layer may comprise the oxide material and the sacrificial layer may comprise the nitride material or vice versa. Etching may be performed by different processes such as, for example, plasma, wet etching or dry etching. For example, during an etching process, the sacrificial layer 18 may be removed while essentially maintaining the electrode seed layer 12 and/or the insulator layer 14.

Figure 2A:
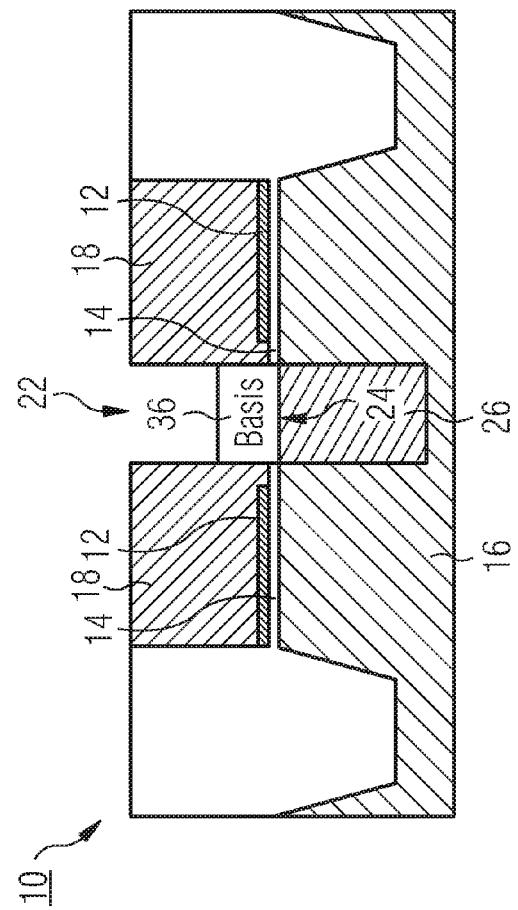
FIG. 2a shows a schematic side view of the stack after a step during which a base structure has been generated according to an embodiment.

FIG. 2a shows a schematic side view of the stack 10 arranged at the semiconductor substrate 16 after a step 120, depicted in FIG. 2b, is performed. In the step 120, a base structure 36 is generated at the collector region 26 and in the recess 22. The base structure 36 contacts and covers the collector region 26 within the recess 22 of the sacrificial layer 18. Simplified, where the recess 22 overlaps with the collector region 26, the collector region 26 may be covered by the base structure 36. The base structure 36 may be generated by growing the base structure 36 at the collector region 26 by selective epitaxy and by growing a (probably p-doped) semiconductor material such as silicon germanium (SiGe). A dopant may be, for example, a germanium material or a carbon material.

Since the recess 22 and therefore the base structure 36 is separated from the electrode seed layer 12 by the sacrificial layer 18, the base structure 36 may be generated (grown) without disturbances of the electrode seed layer 12. In other words, SiGe growth may be undisturbed by the neighboring polysilicon regions, i.e., the electrode seed layer 12.

The base structure 36 may be deposited extensively in the recess 22, i.e., a surface exposed by the recess 22 is covered completely. This allows for the process to be simply stopped when a desired thickness of the base structure 36 along the thickness direction 32 is obtained. Simplified, the base structure 36 is aligned with respect to the collector region 26 by the sacrificial layer 18. The thickness of the base structure 36 along the thickness direction 32 may be, for example, at least 10 nanometer and at the most 200 nanometer, at least 20 nanometer and at the most 100 nanometer or at least 40 nanometer and at the most 50 nanometer. For example, the base structure 36 may be grown as thick as possible before monocrystalline growing switches to polycrystalline or amorphous growing.

An (unchanged) relative position of the recess 22 and the collector region 26 allows for a self-aligning of components arranged in the recess and thus of the base structure with respect to the collector region 26. Further steps of positioning may be unnecessary. Thus, by means of the sacrificial layer 18, the base structure 36 may be aligned with respect to the collector region 26, i.e., a presence of the base structure 36 may be defined by a position of the recess 22.

FIG. 3a shows a schematic side view of the stack 10 obtained after performing a step 130 of the method for manufacturing the transistor, the step 130 illustrated in FIG. 3b. The step 130 comprises generating an emitter structure 38 at the base structure 36 in the recess 22. The emitter structure 38 contacts and at least partially covers the base structure 36 within the recess 22 of the sacrificial layer 18. For example, one or more spacing structures 42 may be generated or arranged at the base structure 36, the spacing structure(s) 42 partially covering a main surface of the base structure 36 averted from the semiconductor substrate 16. The main surface may be parallel to the main surface 24. At a remaining portion of the main surface of the base structure 36, the emitter structure 38 may be generated, for example, by epitaxially growing the emitter structure 38. The emitter structure may, for example a n-doped silicon material. The spacing structure 42 may comprise, for example, a silicon oxide material or a silicon nitride material.

A position of the emitter structure 38 may be adjusted based on a configuration of the spacing structure 42. At regions where the base structure 36 remains uncovered by the spacing structure 42 (i.e., partially or completely) the epitaxial growth of the emitter structure 38 may be obtained. Extensions of the spacing structures 42 along the thickness direction 32 and/or along the lateral direction 44 may at least partially define a remaining volume in the recess 22 in which the emitter structure 38 is grown. For example, the spacing structure 42 may be a so-called L-spacers allowing for a varying extension of the emitter structure 38 along the lateral direction 44. The sacrificial layer 18 allows for a self-aligned growth of the emitter structure 38 with respect to the base structure 36 and with respect to the collector region 26.

In other words, the emitter is deposited by means of epitaxy. The emitter-base link (i.e., a connection between the base structure 36 and the emitter structure 38) may be a single crystalline silicon, whereas elsewhere the emitter growth may be amorphous or polycrystalline. I.e., with increasing thickness of the emitter structure 38 along the thickness direction 32, an initial monocrystalline growth of the emitter structure 38 at the base structure 36 may change to an amorphous or a polycrystalline growth.

FIG. 4a shows a schematic side view of the stack 10 after a step 140 of the method for manufacturing the transistor is performed, the step 140 illustrated in FIG. 4b.

The step 140 comprises removing of the sacrificial layer 18 at least partially such that one or more lateral surface region(s) 46 of the base structure 36 and (when the electrode seed layer 12 is arranged) one or more surface regions of the electrode seed layer 12 are exposed. Simplified, the lateral surface region of the base structure 36 may be understood as a side surface of the base structure 36 facing the electrode seed layer 12. The base structure 36 is not contacting the electrode seed layer 12.

The sacrificial layer 18 may be removed incompletely such that at the insulator layer 14 or at the electrode seed layer 12 there may be a residual portion of the sacrificial layer 18. Alternatively, between the electrode seed layer 12 and the base structure 36, the sacrificial layer 18 may be removed completely. Alternatively, in some embodiments, at the level of the electrode seed layer 12 and between the same and the base structure 36 other material(s) may be arranged, such as a material of the insulator layer 14.

It may be advantageous to remove the sacrificial layer 18 completely between the electrode seed layer 12 and the base structure 36 such that a distance to be bridged between both the base structure 36 and the electrode seed layer 12 by a conductor is reduced or minimized. Additionally, by removing the sacrificial layer 18 completely between the base structure 36 and the electrode seed layer 12, a contact region at the base structure 36 and/or at the seed layer 12 may be increased or maximized.

The sacrificial layer 18 may be removed, for example, by means of dry or wet etching. The emitter structure 38 may be protected from the etching process, for example, by depositing an insulator material or an oxide material 58 (or another material resisting at least partially the process for removing the sacrificial layer 18) before the etching process. The oxide material may comprise, for example, the same material forming the spacing structures 42. Simplified, the emitter structure 38 may be encapsulated by the insulator material, the spacer structure 42 and the base structure 36. After the etching process, the insulator material 58 may be removed at least partially such that the emitter structure 38 is at least partially exposed and may be contacted electrically. After exposing the emitter structure 38, further processes for structuring the same may be unnecessary.

In other words, the side walls of the base structure 36 and of the polysilicon nucleation layer (electrode seed layer) may be opened and left open for further processing.

Figure 5B:
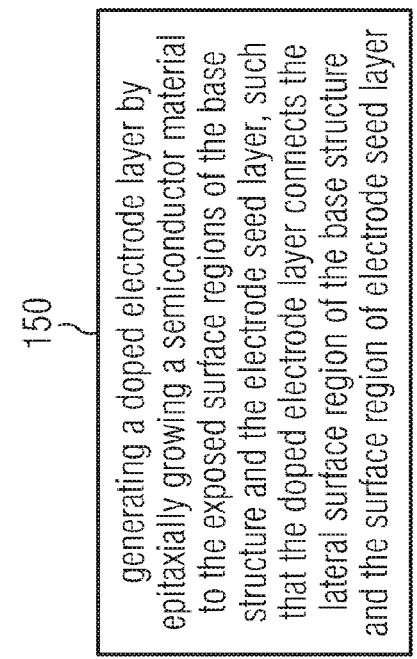
FIG. 5b shows the step of FIG. 5a according to an embodiment.
Figure 5A:
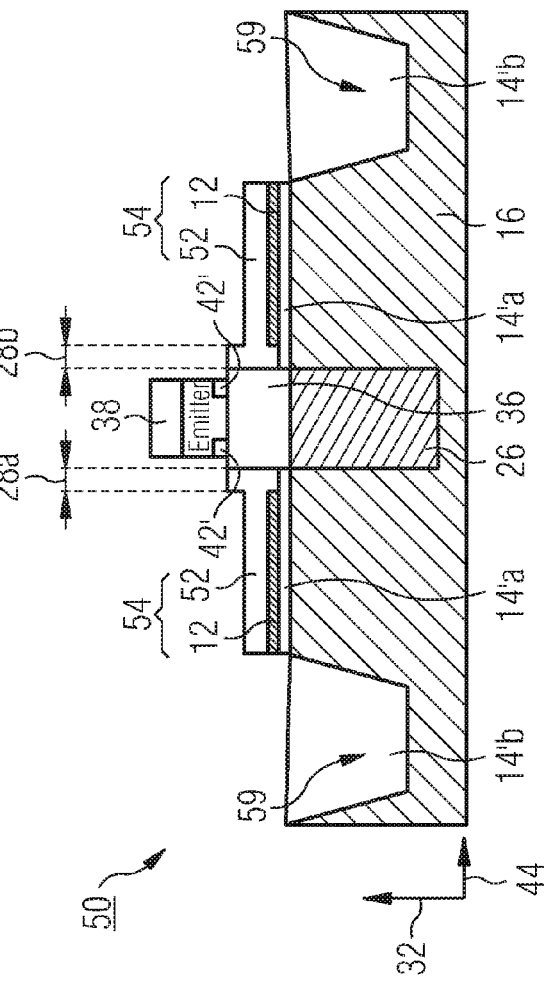
FIG. 5a shows a schematic side view of a transistor obtained after a step during which an a doped electrode layer is generated according to an embodiment.

FIG. 5a shows a schematic side view of a transistor 50 obtained after performing a step 150 of the method for manufacturing the transistor 50, the step 150 shown in FIG. 5b. The step 150 comprises generating a doped electrode layer 52 by epitaxially growing a (doped) semiconductor material to the exposed surface regions of the base structure 36 and of the electrode seed layer 12, such that the doped electrode layer 52 connects the previously opened lateral surface region of the base structure 36 and (when present) of the surface region of the electrode seed layer 12. The growth of the doped electrode layer 52 may also be self-aligned as the exposed region of the base structure 36 (and, when present, of the electrode seed layer 12) may influence or define a region at which the growth is performed.

In FIG. 5a, the residual of the sacrificial layer 18 shown in FIG. 4a has been removed. Thus, the epitaxial growth may be obtained at a main surface of the electrode seed layer 12 averted from the semiconductor substrate 16 and at a side wall or side surface of the electrode seed layer 12 facing the base structure 36. At the electrode seed layer, the doped electrode layer 52 may be also polycrystalline or amorphous.

When the base structure 36 is grown monocrystalline, the epitaxial growth of the doped electrode layer 52 may also be monocrystalline at a region thereof connecting to the base structure 36. A thickness of the doped electrode layer 52 along the thickness direction 32 may be higher when compared to a corresponding thickness at regions where the electrode seed layer 12 is arranged along the distances 28a and 28b, previously defined by the sacrificial layer.

Growing the doped electrode layer 52 by growing a doped silicon material allows for a doping of the doped electrode layer 52 adjacent to the base structure 36.

When the electrode seed layer 12 is present, the growth of the doped electrode layer 52 may be enhanced as the growth starts at both, the base structure 36 and the electrode seed layer to bridge the same. Alternatively, the doped electrode layer may be grown without the electrode seed layer, probably with a shorter extension along the lateral direction 44. The doped electrode layer 52 may be obtained, for example, by growing a semiconductor material, such as a silicon material and/or a gallium arsenic material. For example, a dopant for doping the semiconductor material may be boron, antimony, phosphorus, arsenic or other materials.

The insulator layer 14 may be removed partially at trenches 59 formed in the semiconductor substrate 16 to reduce a thickness of the stack. One or more base electrodes 54 comprising the electrode seed layer 12 and the doped electrode layer 52 may be separated (insulated) from the semiconductor substrate 16 by remaining portions 14'a of the insulator layer. Remaining portions 14'b of the insulator layer arranged at the trenches (notches) of the semiconductor substrate 16 may allow for separating the transistor 50, for example, with respect to adjacent components or regions.

Simplified, the portions 14'b may allow for a so-called shallow trench isolation (STI).

The spacing structure 42 may be removed, wherein one or more portions 42' thereof may remain between the emitter structure 38 and the base structure 36, for example, when the spacing structure 42 is removed by an etching process along a direction opposing the thickness direction 32.

By performing the steps 110 to 150, a partially or fully self-aligned bipolar device, such as a transistor, may be obtained. Self-aligning may be achieved by the sacrificial layer, the recess therein respectively.

In other words, the base electrode (doped electrode layer 52) is deposited by means of selective epitaxy. The electrode may be a highly in situ boron doped semiconductor material, e.g., silicon or silicon germanium. The growth at the base link, i.e., at the lateral surface region, is epitaxial. The growth in the electrode lateral extension, along the nucleation poly layer, may be polycrystalline or amorphous when the electrode seed layer is formed polycrystalline or amorphous. The remaining oxide layers may be removed by means of a recess dry etching which may be similar to STI deglaze etch.

By performing the steps 110-150 above, a single crystalline hetero junction between the base structure 36 and the electrodes 54 connecting the same may be obtained. Connections of the diodes between the collector region 26, the base structure 36 and the emitter structure 38 may be obtained by means of epitaxial growing and thus may be monocrystalline. This allows for low Ohmic resistances of the diodes and thus for a low capacitance thereof. The monocrystalline connection of the base structure 36 by the doped electrode layer 52 allows for obtaining a monocrystalline connection of the base structure 36. Additionally, the doped electrode layer 52 may be doped (immediately) adjacent to the base structure 36 allowing for a low Ohmic resistance and a low electrical capacitance.

The low resistances and capacitances enables an operation of the transistor 50 with high frequencies which may be higher than 500 Gigahertz, 700 Gigahertz or even more.

Although the transistor 50 is obtained by growing epitaxially the base structure 36, the emitter structure 38 and the doped electrode layer 52, this ostensible high complexity may allow for an increased performance when compared to transistors obtained by a conventional approach using undercuts and/or sub-etching processes. Sub-etching processes for obtaining undercut structures may have disadvantages when aligning the base structure, the emitter structure and/or connections of the base structure. By utilizing a self-aligning of the components as described above, inaccuracies due to shifts or varying etching rates during the sub-etching processes may be avoided.

Simplified, the growth of the doped electrode layer 52 may be polycrystalline at the electrode seed layer 12 along the thickness direction 32. When there is no electrode seed layer 12 arranged, the electrode 54 may be formed by the doped electrode layer 52 and by growing the same along the direction 44. When the electrode seed layer 12 is arranged, the doped electrode layer 52 may bridge the distance 28a and/or 28b between the base structure 36 and the electrode seed layer 12. The base structure 36 may comprise a thickness along the thickness direction 32 that is greater than a thickness of the insulator layer 14 at least for a portion of the insulator layer 14. The portion may refer to a part of the insulator layer 14 arranged between the semiconductor substrate 16 and the doped electrode layer 52.

The steps 110, 120, 130, 140 and 150 may be performed without a temperature annealing. By arranging the base structure 36, the emitter structure 38 and the doped electrode layer 52 by epitaxial growing, an annealing step for curing the material contacting the base structure may be unnecessary. For example, when a silicon material connecting the base structure 36 as an electrode would doped by implantation an annealing step might be necessary to cure (heal) the crystalline structure of the doped material. The annealing may be required for overcoming the dopant gap and may lead to germanium redistribution due to polysilicon proximity which may lead to a non-uniform growth. The described method allows for a reduced thermal budget of the process and by this for a reduced thermal stress applied to the transistor 50. For example, the collector region 26 may be annealed before the base structure 36 and the emitter structure 38 are generated such that this temperature annealing may have no effects on the later production process.

Figure 6:
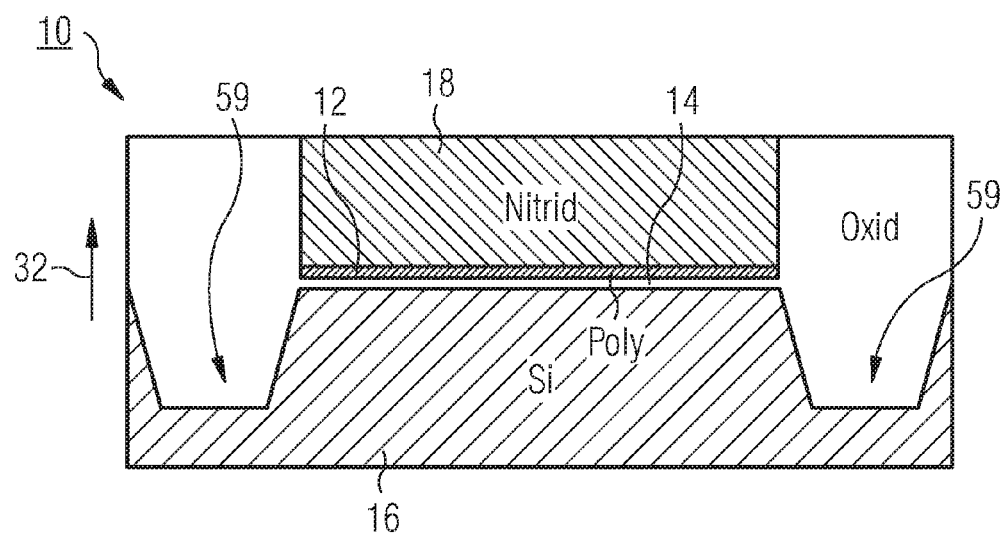
FIG. 6 shows a schematic side view of the semiconductor substrate and the stack after an STI etch according to an embodiment.

FIG. 6 shows a schematic side view of the semiconductor substrate and the stack 10 arranged at the semiconductor substrate 16 as it may be obtained, for example, after an STI etch. The obtained trenches 59 may be filled with the insulator layer 14 forming layer barriers at a region of the trenches 59 in the semiconductor substrate 16. The insulator layer 14 may comprise a low thickness along the thickness direction 32 in regions between the trenches and when compared to a corresponding thickness of the insulator layer 14 in a region of the trenches.

At the insulator layer 14 and between the trenches 59, the electrode seed layer 12 is arranged. At the electrode seed layer 12, the sacrificial layer 18 is arranged such that the electrode seed layer 12 is covered by the sacrificial layers 18 and the insulator layer 14.

In other words, FIG. 6 shows the state of the STI etch, fill and subsequent chemical/mechanical polishing of the stack 10. The thin undoped amorphous or polysilicon layer (electrode seed layer 12) underneath the pad nitride (sacrificial layer 18) may be an important peculiarity. This layer may also be a pad layer. It may be patterned together with then nitride during the STI patterning and requires only a subtle reactive-ion etching (RIE). Thus, the insulator layer 14 may be arranged at the semiconductor substrate 16 followed by an arrangement of the electrode seed layer 12 and of the sacrificial layer 18.

Figure 7A:
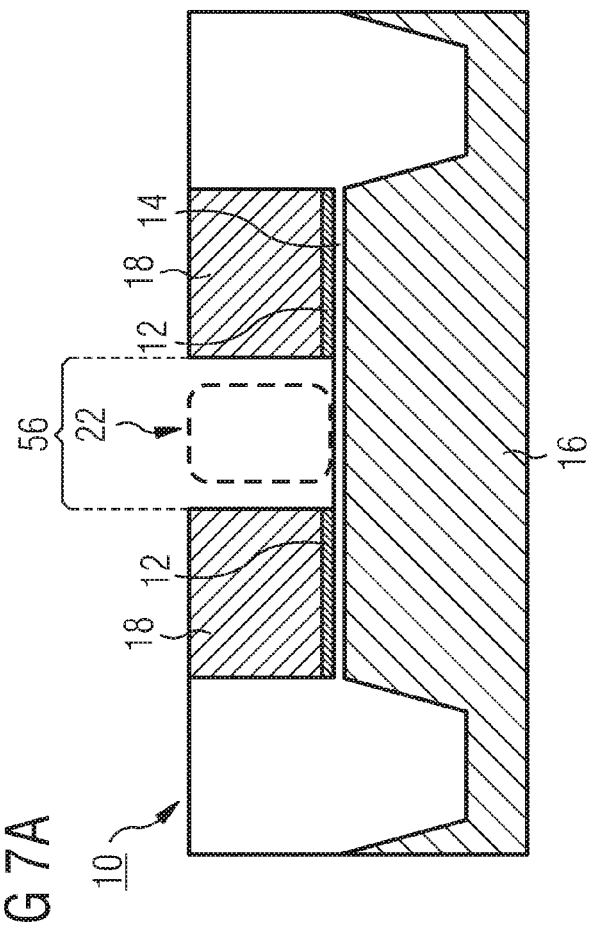
FIG. 7a shows a schematic side view of the stack after a step during which the sacrificial layer is removed in a separating region according to an embodiment.
Figure 7B:
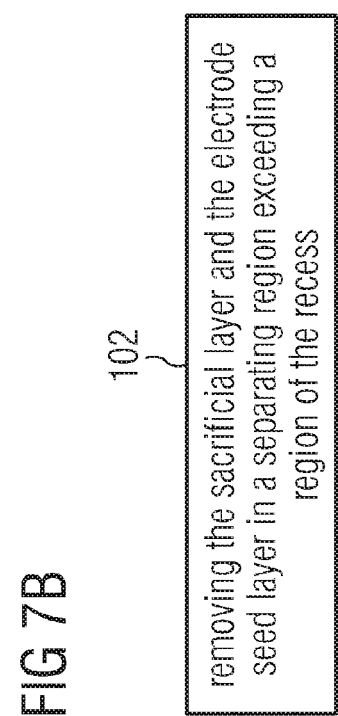
FIG. 7b shows the step of FIG. 7a according to an embodiment.

FIG. 7a shows a schematic side view of the stack 10 after a step 102 is performed illustrated in FIG. 7b. The step 102 may be a step of the method for manufacturing the transistor and may be performed before the step 110. The step 102 comprises removing the sacrificial layer 18 and the electrode seed layer 12 in a separating region 56 exceeding a region of the (later) recess 22.

The separating region 56 may be understood as an emitter window and may be patterned into the sacrificial layer 18 (e.g., a pad nitride block) by a combination of conventional lithography and dry etch. The nucleation poly layer (electrode seed layer 12) is etched through. The edging may selectively stop on pad oxide (insulator layer 14).

Figure 8A:
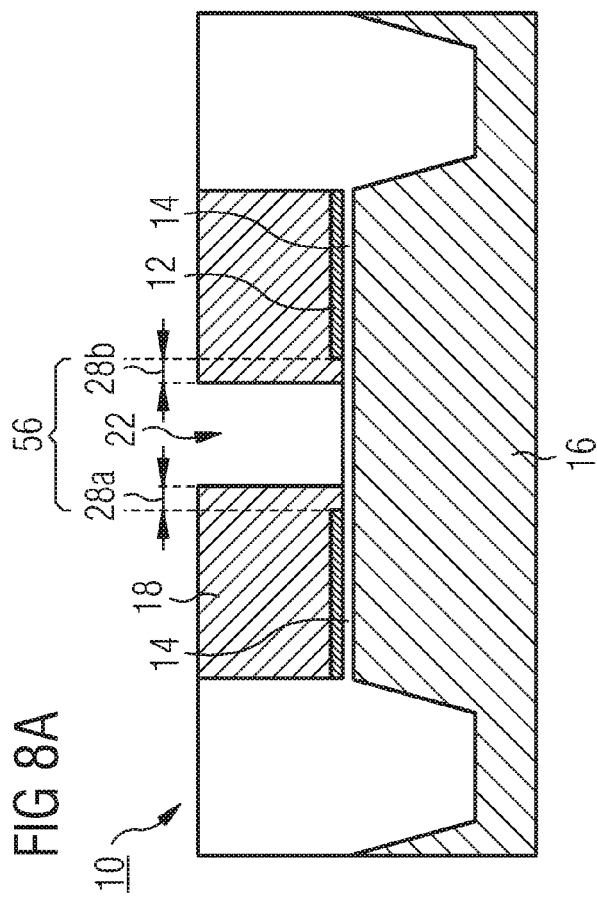
FIG. 8a shows a schematic side view of the stack after a step during which the sacrificial layer is re-arranged according to an embodiment.
Figure 8B:
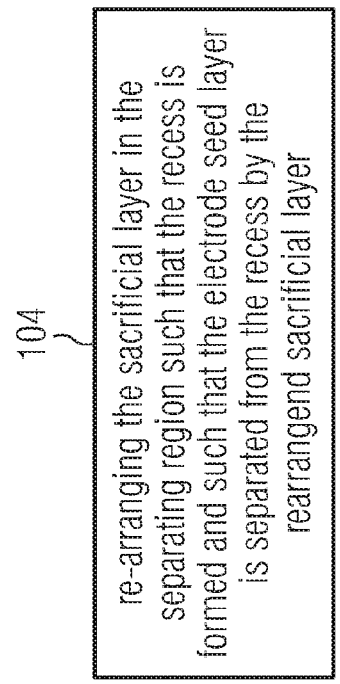
FIG. 8b shows the step of the method of FIG. 8a according to an embodiment.

FIG. 8a shows a schematic side view of the stack 10 after a step 104 shown in FIG. 8b is performed. The step 104 may be a step of the method for manufacturing the transistor and may be performed after the step 102. The step 104 comprises re-arranging of the sacrificial layer 18 in the separating region 56 such that the recess 22 is formed (i.e., the recess may remain) and such that the electrode seed layer 12 is separated from the recess 22 by the re-arranged sacrificial layer 18. Simplified, the sacrificial layer 18 is re-arranged along the distances 28a and 28b such that the electrode seed layer 12 is covered by the sacrificial layer 18 by a re-arranged "nose" thereof respectively.

Alternatively, when the electrode seed layer 12 is not arranged, re-arranging the sacrificial layer 18 may be skipped, for example, when during the step 102 the sacrificial layer 18 is only removed in a region of the recess 22.

In other words, a usual nitride spacer flow may be applied to the wafer to trim the emitter window to the desired dimension, i.e., the dimension of the recess 22. The emitter window may be trimmed to the desired dimension and to isolate the edge of the nucleation poly from the collector-base junction of the transistor, i.e., of the recess 22 in which the base will be formed later.

Figures 9A, 9B:
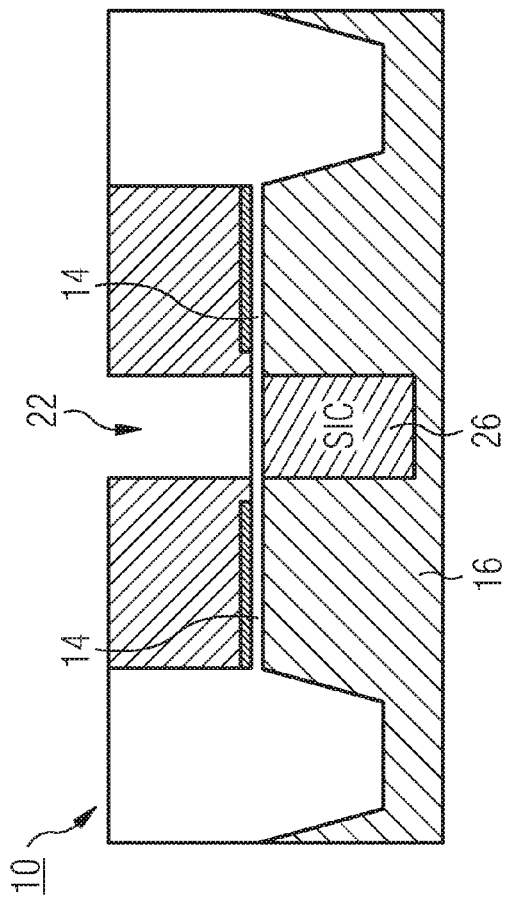
FIG. 9a shows a schematic side view of the stack after a step during which a collector region is generated according to an embodiment.
FIG. 9b shows the step of FIG. 9a according to an embodiment.

FIG. 9a shows a schematic side view of the semiconductor substrate 16 and the stack 10 obtained after performing a step 106 which is illustrated in FIG. 9b. The step 106 may be a part of the method for manufacturing the transistor and may be performed after the step 102 or 104 and before the step 110. The step 106 comprises generating the collector region 26 in the semiconductor substrate 16 by implantation, wherein the implantation may be performed through the insulator layer 14. In other words, SIC may be implanted through the natural nitride hard mask and/or the oxide to obtain an n-doped region. Alternatively, the oxide may be removed before implanting in a region of the recess 22. An annealing step may be performed subsequently. The base structure, the emitter structure and the dope3d electrode layer may remain unaffected by a temperature stress generated by the annealing, when the annealing is performed before the generation of the structures. The pad oxide (insulator layer 14) may be opened (removed) in the region of the recess 22, before or after the implantation, for example, by wet etching. The substrate surface may be conditioned, i.e., cleaned and/or prepared for epitaxial growth.

Figure 10B:
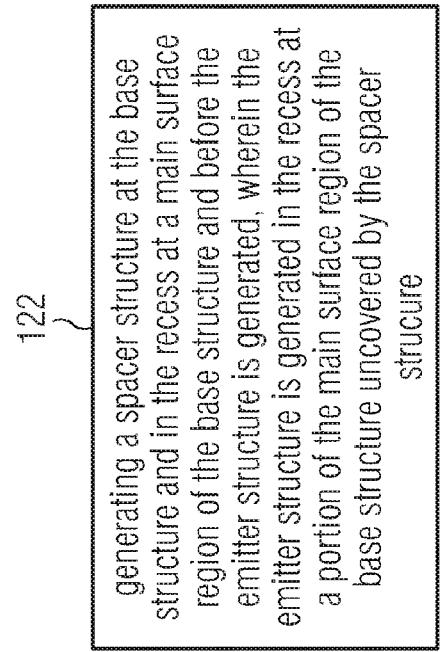
FIG. 10b shows the step of FIG. 10a according to an embodiment.
Figure 10A:
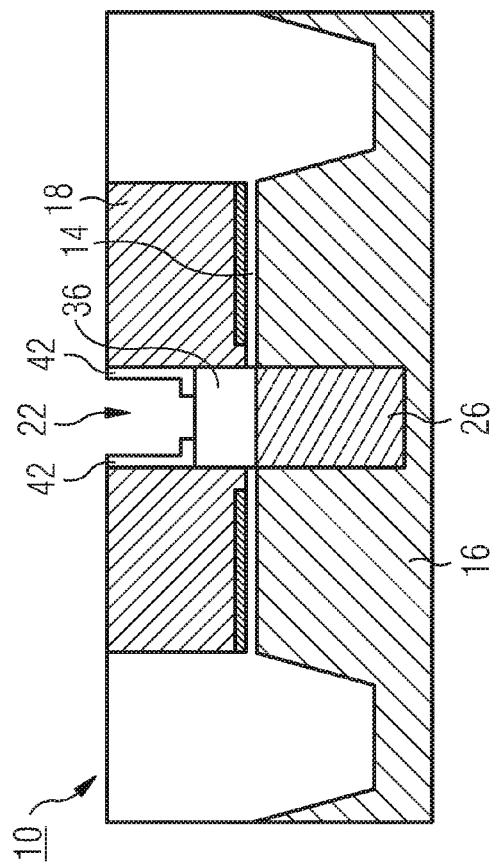
FIG. 10a shows a schematic side view of the stack after a step during which a spacer structure is generated according to an embodiment.

FIG. 10a shows a schematic side view of the semiconductor substrate 16 and the stack 10 after performing a step 122 depicted in FIG. 10b. The step 122 may be performed, for example, after the step 120 and may be a part of the method for manufacturing the transistor. The step 122 comprises generating the spacer structure 42 at the base structure 36 at a main surface region of the base structure 36 and before the emitter structure is generated. The emitter structure is generated in the recess 22 at a portion of the main surface region of the base structure 36 uncovered by the spacer structure 42.

In other words, the emitter L-spacer is produced by a conventional approach. The emitter structure 38 may be grown at the base structure 36 aligned by the recess 22 and the spacing structure 42.

Figure 11:
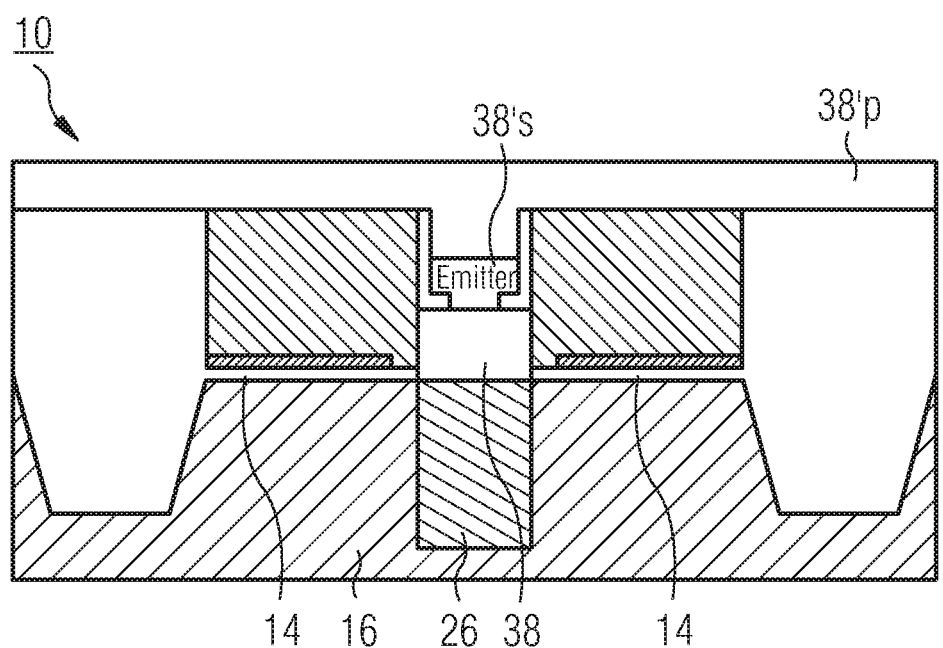
FIG. 11 shows a schematic side view of the stack after an epitaxial growth of an emitter structure according to an embodiment.

FIG. 11 shows a schematic side view of the semiconductor substrate 16 and the stack 10 after an epitaxial growth of an emitter structure 38' probably in the recess 22 and after the step 122. Adjacent to the base structure 36 the epitaxial growth and thus an emitter-base link may comprise a single crystalline material 38's. At a distance to the base structure 36 and as indicated by a second shading, the emitter growth may comprise an amorphous or polycrystalline structure 38'p. When the emitter structure 38 comprises a low thickness, e.g., of at most 10 nm, of at most 20 nm or at most 30 nm, the emitter structure 38 may comprise exclusively or essentially a monocrystalline structure. Material of the emitter structure 38' exceeding the recess may be removed subsequently, probably to obtain a stack illustrated in FIG. 3a.

In other words, unnecessary emitter silicon may be recessed, for example, by means of dry etching. However, a sufficient amount of material is left within the emitter window to later secure a good silicide building.

Figure 12A:
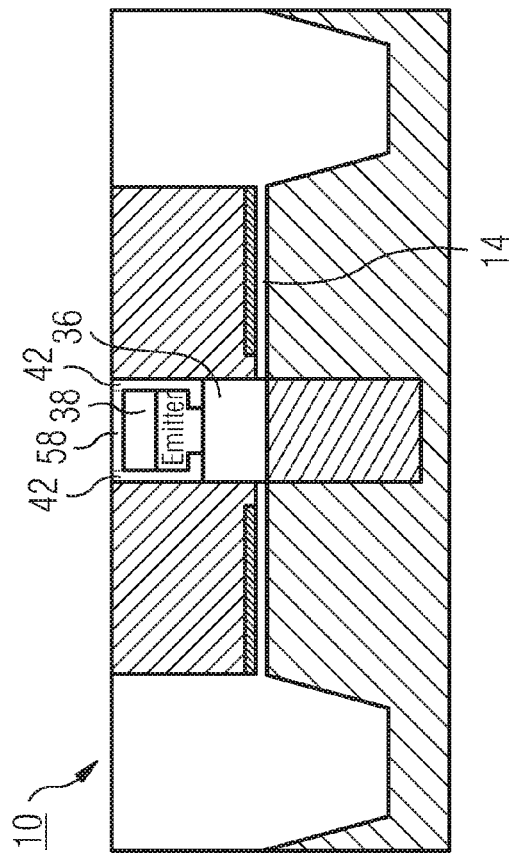
FIG. 12a shows a schematic side view of the stack after a step during which an insulator material is arranged at the emitter structure according to an embodiment.
Figure 12B:
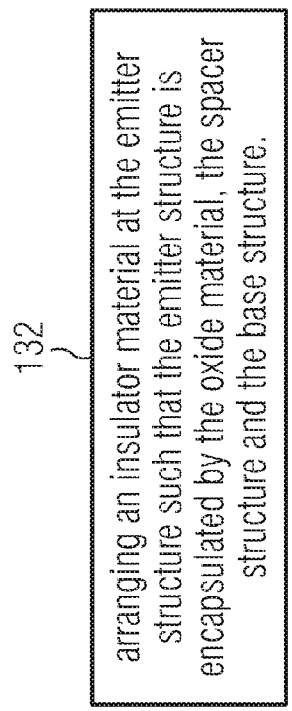
FIG. 12b shows the step of FIG. 12a according to an embodiment.

FIG. 12a shows a schematic side view of the stack 10 arranged at the semiconductor substrate 16 after a step 132 depicted in FIG. 12b has been performed. The step 132 may be a part of the method for manufacturing the transistor and may be performed, for example, after the step 130. The step 132 comprises arranging the insulator material 58 at the emitter structure 38 such that the emitter structure 38 is encapsulated by the insulator material 58, the spacer structure 42 and the base structure 36.

In other words, the cavity in the emitter window may be deliberately plugged by the oxide. This can be achieved by a combination of a deposition and subsequent recess either by rough CMP or selective dry etch.

Figure 13:
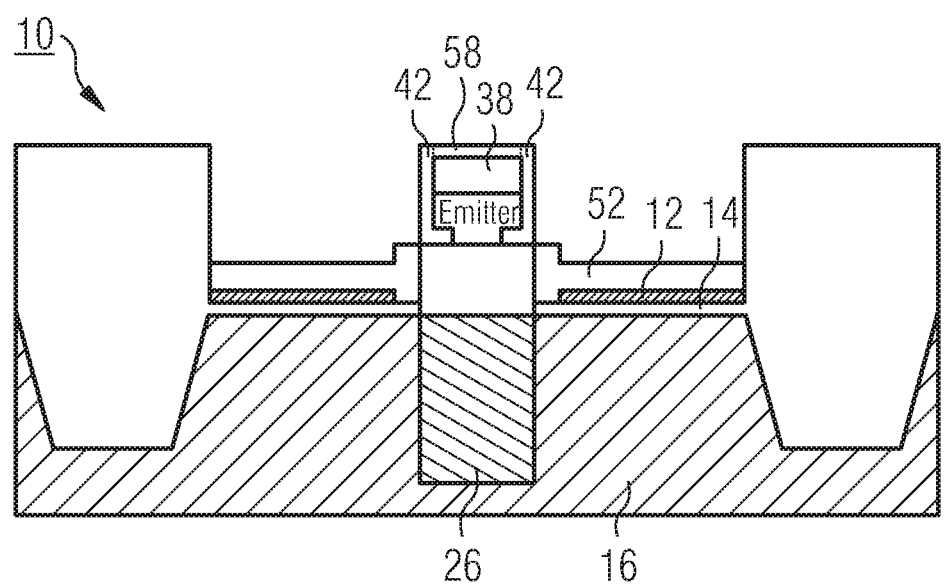
FIG. 13 shows a schematic side view of the stack after a step comprising removing of the sacrificial layer according to an embodiment.

FIG. 13 shows a schematic side view of the stack 10 arranged at the semiconductor substrate 16 which may be obtained, for example, after the step 140 is performed and before the step 150 is performed. The doped electrode layer 52 is arranged at the optional electrode seed layer 12, The emitter structure 38 is still encapsulated by the spacer structure 42 and the insulator material 58. This may allow for preventing the material of the doped electrode layer from growing additional structures at the emitter structure 38. The insulator material 58 and/or the spacing structures 42 may be removed at least partially afterwards for enabling contacting the emitter structure 38.

Embodiments described herein may be used in switching devices, especially in high speed switching devices. Such devices may be, but are not limited to, radar devices such as Short Range Radar (SRR) or Long Range Radar (LRR) or other devices generating electromagnetic waves in an MM-range such as in communication applications.

In other words, embodiments enable selective SiGe base epitaxy on top of virtually defect free Si substrate and without surrounding polycrystalline silicon. High purity, defect free epitaxy is enabled by some embodiments. Germanium redistribution due to polysilicon presence is avoided by some embodiments. Embodiments enable fully self-aligned highly in situ doped electrodes with monocrystalline connection to the base without dopant gaps. Some embodiments strongly reduce process complexity compared to known concepts.

Embodiments may use a combination of selective CMP, wet- and dry etches, selective epitaxies to create a fully self-aligned device circumventing multiple structural difficulties and using already existing processes. Embodiments provide fully single crystalline hetero junction devices, incorporating single crystalline highly doped base links. Buried nucleation layers for rapid electrode extension growth may be used by some embodiments. Embodiments provide a simplified integration scheme when compared to known concepts.

Above described embodiments comprise a growing of the base structure, the emitter structure and the doped electrode layer. A thickness desired may be obtained by epitaxial growing by stopping the process after the thickness has been obtained. Alternatively, a higher thickness may be grown and reduced afterwards, e.g., during an etching or polishing process to obtain specific surface conditions.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus.

The above described embodiments are merely illustrative for the principles of the present invention. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

The invention claimed is:

1. Method for manufacturing a transistor, the method comprising:
    arranging a stack on a semiconductor substrate, the stack comprising a sacrificial layer and an insulator layer; the insulator layer at least partially being arranged between the semiconductor substrate and the sacrificial layer, wherein a recess is formed within the stack, wherein the recess extends through the stack to the semiconductor substrate, so that the recess at least partially overlaps with a collector region of the semiconductor substrate, and wherein the collector region extends from a main surface of the semiconductor substrate into a substrate material of the semiconductor substrate;
    generating a base structure at the collector region and in the recess, wherein the base structure contacts and covers the collector region within the recess of the sacrificial layer;
    generating an emitter structure at the base structure, wherein the emitter structure contacts and at least partially covers the base structure within the recess of the sacrificial layer;
    removing the sacrificial layer at least partially such that a lateral surface region of the base structure is exposed; and
    generating a doped electrode layer by epitaxially growing a semiconductor material to the exposed lateral surface region of the base structure, such that the doped electrode layer connects the lateral surface region of the base structure.

2. The method according to claim 1, wherein, during generating the doped electrode layer, the doped electrode layer is grown monocrystalline at the base structure in a lateral direction perpendicular to a surface normal of the semiconductor substrate.

3. The method according to claim 1, wherein, during generating the base structure, the base structure is deposited extensively in the recess such that the base structure is aligned with respect to the collector region and with respect to the recess.

4. The method according to claim 1, further comprising:
    generating a spacer structure at the base structure and in the recess at a main surface region of the base structure and before the emitter structure is generated;
    wherein the emitter structure is generated in the recess at a portion of the main surface region of the base structure uncovered by the spacer structure.

5. The method according to claim 4, further comprising:
    arranging an insulator material at the emitter structure such that the emitter structure is encapsulated by the insulator material, the spacer structure and the base structure.

6. The method according to claim 1, wherein the stack further comprises an electrode seed layer arranged between the insulator layer and the sacrificial layer, wherein the insulator layer is arranged between the semiconductor substrate and the electrode seed layer, and wherein the sacrificial layer spaces the electrode seed layer from the recess;

wherein, during removing the sacrificial layer, a surface region of the electrode seed layer is exposed; and wherein, during generating the doped electrode layer, the semiconductor material is grown to the exposed surface region of the electrode seed layer, such that the doped electrode layer connects the exposed lateral surface region of the base structure and the surface region of the electrode seed layer.

7. The method according to claim 6, wherein, during generating the doped electrode layer, the doped electrode layer is grown amorphous or polycrystalline at the electrode seed layer along a thickness direction parallel to a direction of a normal of the main surface.

8. The method according to claim 1, wherein arranging the stack comprises:

providing the semiconductor substrate;

arranging the insulator layer at the semiconductor substrate;

arranging an electrode seed layer at the insulator layer;

arranging the sacrificial layer at the electrode seed layer;

removing the sacrificial layer and the electrode seed layer in a separating region exceeding a region of the recess; and re-arranging the sacrificial layer in the separating region such that the recess is formed and such that the electrode seed layer is separated from the recess by the re-arranged sacrificial layer.

9. The method according to claim 8, wherein during arranging the electrode seed layer, the electrode seed layer is arranged by depositing an amorphous silicon material or a polysilicon material at the insulator layer.

10. The method according to claim 8, wherein, during removing the electrode seed layer, the electrode seed layer is removed such that a distance between the recess and the electrode seed layer of at least 5 nm and at most 100 nm is obtained.

11. The method according to claim 1, wherein arranging the stack comprises:

generating the collector region in the recess and in the semiconductor substrate by implantation, wherein the implantation is performed through the insulator layer.

12. The method according to claim 1, wherein arranging the stack further comprises arranging the sacrificial layer by depositing a silicon nitride material at the insulator layer or at an electrode seed layer.

13. The method according to claim 1, wherein arranging the stack further comprises arranging the insulator layer such that a thickness of the insulator layer of at least 15 nm and at most 200 nm along a thickness direction parallel to a direction of a normal of the main surface of the semiconductor substrate is obtained.

14. The method according to claim 1, wherein, during generating the base structure, the base structure is grown such that a thickness of the base structure of at least 40 nm and at most 50 nm along a thickness direction parallel to a direction of a normal of the main surface of the semiconductor substrate is obtained.

15. The method according to claim 1, wherein, during generating the doped electrode layer, the doped electrode layer is generated by epitaxially growing using a silicon material and a boron material.

16. The method according to claim 1, wherein generating the doped electrode layer is performed without a temperature annealing.

* * * * *